United States Patent [19]
Kalafatis

[11] Patent Number: 5,546,434
[45] Date of Patent: Aug. 13, 1996

[54] DUAL EDGE ADJUSTING DIGITAL PHASE-LOCKED LOOP HAVING ONE-HALF REFERENCE CLOCK JITTER

[75] Inventor: Stavros Kalafatis, Hillsboro, Oreg.

[73] Assignee: Intel Corporation, Santa Clara, Calif.

[21] Appl. No.: 441,933

[22] Filed: May 16, 1995

[51] Int. Cl.⁶ .................................................. H03D 3/24
[52] U.S. Cl. .............................. 375/376; 331/34; 331/1A
[58] Field of Search ......................... 375/376, 371, 375/215, 294, 327; 331/1 A, 1 R, 34, 11, 14, 18; 327/147, 149, 150, 156, 158, 159

[56] References Cited

U.S. PATENT DOCUMENTS

| | | | |
|---|---|---|---|
| 4,617,679 | 9/1983 | Brooks | 375/119 |
| 5,036,297 | 7/1991 | Nakamura | 331/17 |
| 5,077,529 | 12/1991 | Ghoshal et al. | 328/155 |
| 5,109,394 | 4/1992 | Hjerpe et al. | 375/119 |
| 5,218,314 | 5/1992 | Efendovich et al. | 328/155 |
| 5,355,092 | 10/1994 | Kosaka et al. | 329/304 |
| 5,428,648 | 6/1995 | Fukuda | 375/371 |

*Primary Examiner*—Stephen Chin
*Assistant Examiner*—Don Vo
*Attorney, Agent, or Firm*—Blakely, Sokoloff, Taylor & Zafman

[57] ABSTRACT

A digital phase-locked loop having a jitter limited to one-half of a period of the reference clock comprises a generator circuit and a control circuit. The input clock is defined by a plurality of rising edges and falling edges. The generator circuit receives a reference clock and generates the output clock. The phase of the output clock is one of a plurality of selectable phases such that the difference in phases between the output clock and the input clock is limited to one-half of a period of the reference clock once the DPLL locks to the input clock. The control circuit receives the input clock, the reference clock, and the output clock and provides a selection input to the generator circuit to make the phase of the output clock selectable upon each rising edge and upon each falling edge of the input clock.

23 Claims, 7 Drawing Sheets

DUAL EDGE ADJUSTING DIGITAL PHASE-LOCKED LOOP HAVING ONE-HALF REFERENCE CLOCK JITTER

FIELD OF THE INVENTION

The present invention pertains to the field of digital communications. More particularly, the present invention relates to digital phase-locked loops used for providing an output signal which is locked to an input signal.

BACKGROUND OF THE INVENTION

Phase-locked loops (PLL's) are commonly used to perform a multitude of different functions in electrical and electronic systems. Such functions include tone decoding, demodulation of communication signals, frequency multiplication, frequency synthesis, pulse synchronization, and signal regeneration, for example. In a digital communication system, one application of a PLL may be to provide a "clean" clock signal which has the same frequency and phase as a received digital data signal that is to be decoded. Digital phase-locked loops (DPLL's) are often preferable to analog PLL's for this purpose, because they tend to require less time and effort to design.

One problem associated with DPLL's, however, is that, as a result of their discrete nature, they normally cannot generate an output clock with a phase that is precisely locked to the phase of the input signal. A typical DPLL design makes use of a reference clock having a frequency that is much higher than that of the data signal to generate the output clock. However, a typical DPLL can only guarantee a phase lock to within one clock period of the reference clock. This error in the phase lock is referred to as "jitter". "Jitter" can be more precisely defined as any short-term variations of the significant instances of a digital signal from their ideal positions in time. In addition, a typical DPLL will only adjust its lock once for every clock cycle of the data signal or the output clock (e.g., on every rising edge of the data signal), which limits how quickly the DPLL can lock onto the input signal. Consequently, as design requirements for the maximum allowable jitter (accuracy of the phase lock) and the time-to-lock become more demanding, the required reference clock frequency increases. A high reference clock frequency may be undesirable for various different reasons, however.

Therefore, it is desirable to provide a DPLL which has a maximum jitter that is less than one full period of the reference clock. It is further desirable to provide a DPLL that will adjust its phase lock more frequently than once for each period of the data signal or the output clock, so that the time required to achieve phase lock may be reduced.

SUMMARY OF THE INVENTION

A digital phase-locked loop (DPLL) for generating an output clock having a frequency and a phase which are locked to an input clock is described. The input clock has a plurality of rising edges and falling edges. The DPLL comprises a generator circuit and a control circuit. The generator circuit receives a reference clock and generates the output clock. The phase of the output clock is one of a plurality of selectable phases, such that the difference in phases between the output clock and the input clock is limited to one-half of a period of the reference clock once the DPLL is locked to the input clock. The control circuit receives the input clock, the reference clock, and the output clock and provides a selection input to the generator circuit. The control circuit, through the selection input, causes the phase of the output clock to be selectable upon each rising edge and upon each falling edge of the input clock.

Other features of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A digital phase-locked loop (DPLL) for generating an output clock having a frequency and a phase which are locked to an input clock is described. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form in order to avoid unnecessarily obscuring the present invention.

Figure 1:
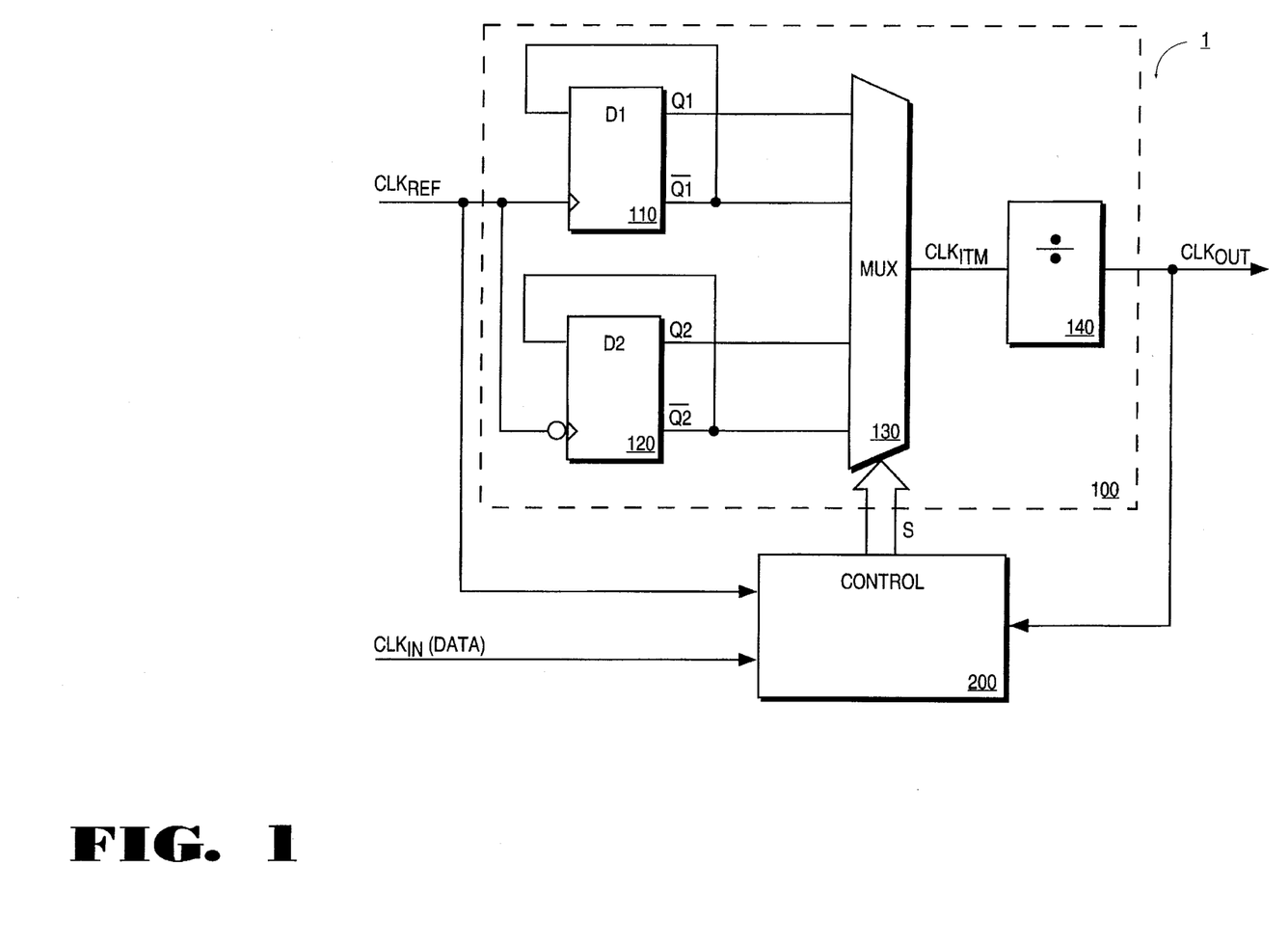
FIG. 1 illustrates a digital phase-locked loop.

FIG. 1 shows an embodiment of a digital phase locked loop (DPLL) 1 according to the present invention. The DPLL 1 provides an output clock signal CLKOUT which is locked in frequency and phase to an input digital data signal DATA. The output clock signal CLKOUT is provided such that the difference in phase between the output clock signal CLKOUT and the input clock signal CLKIN does not exceed one-half of a period of the reference clock signal CLKREF once the lock has been achieved, as will be described in detail below. In addition, the DPLL 1 provides for adjustment of the phase of the output clock CLKOUT at every rising edge and every falling edge of the input clock CLKIN.

The DPLL 1 is comprised of a generator circuit 100 and a control circuit 200. The generator circuit receives as input a reference clock signal CLKREF and generates as output the output clock signal CLKOUT. The control circuit 200 receives as input an input clock signal CLKIN and the output clock signal CLKOUT. The control circuit 200 also receives as input the reference clock CLKREF and generates as an output a selection signal S to the generator circuit 100. The input clock signal CLKIN is the inverted form of the digital data signal (i.e., $\overline{\text{DATA}}$). Consequently, the output clock signal CLKOUT will actually be locked 180 degrees out-of-phase with the digital data signal DATA and in-phase with the input clock signal CLKIN. The frequency of the data signal DATA in the illustrated embodiment is 4.096 MHz. The frequency of the reference clock is sixteen times the frequency of the data signal DATA, or approximately 65 MHz. Other embodiments of the present invention, however, may utilize different frequencies.

The generator circuit 100 is comprised of two D-type flip-flops 110 and 120, a multiplexor 130, and a frequency divider 140. The multiplexor 130 has four inputs, one each to receive the outputs Q1 and $\overline{Q1}$ of flip-flop 110 and the Outputs Q2 and $\overline{Q2}$ of flip-flop 120. The input of flip-flop 110 is coupled to receive its output $\overline{Q1}$. Similarly, the input of flip-flop 120 is coupled to receive its output $\overline{Q2}$. Flip-flop 110 is clocked by the reference clock CLKREF. Flip-flop 120 is clocked by the inverted form of the reference clock $\overline{CLKREF}$. The multiplexor 130 outputs an intermediate clock signal CLKITM to frequency divider 140. The output CLKITM of the multiplexor 130 represents one of the four inputs Q1, Q2, $\overline{Q1}$, and $\overline{Q2}$, according to the state of the selection signal S. The frequency divider 140 receives as input the intermediate clock signal CLKITM and generates the output clock signal CLKOUT. In the embodiment of FIG. 1, the frequency divider 140 divides the intermediate clock signal CLKITM by a factor of 8 to produce the output clock signal CLKOUT.

Figure 2:
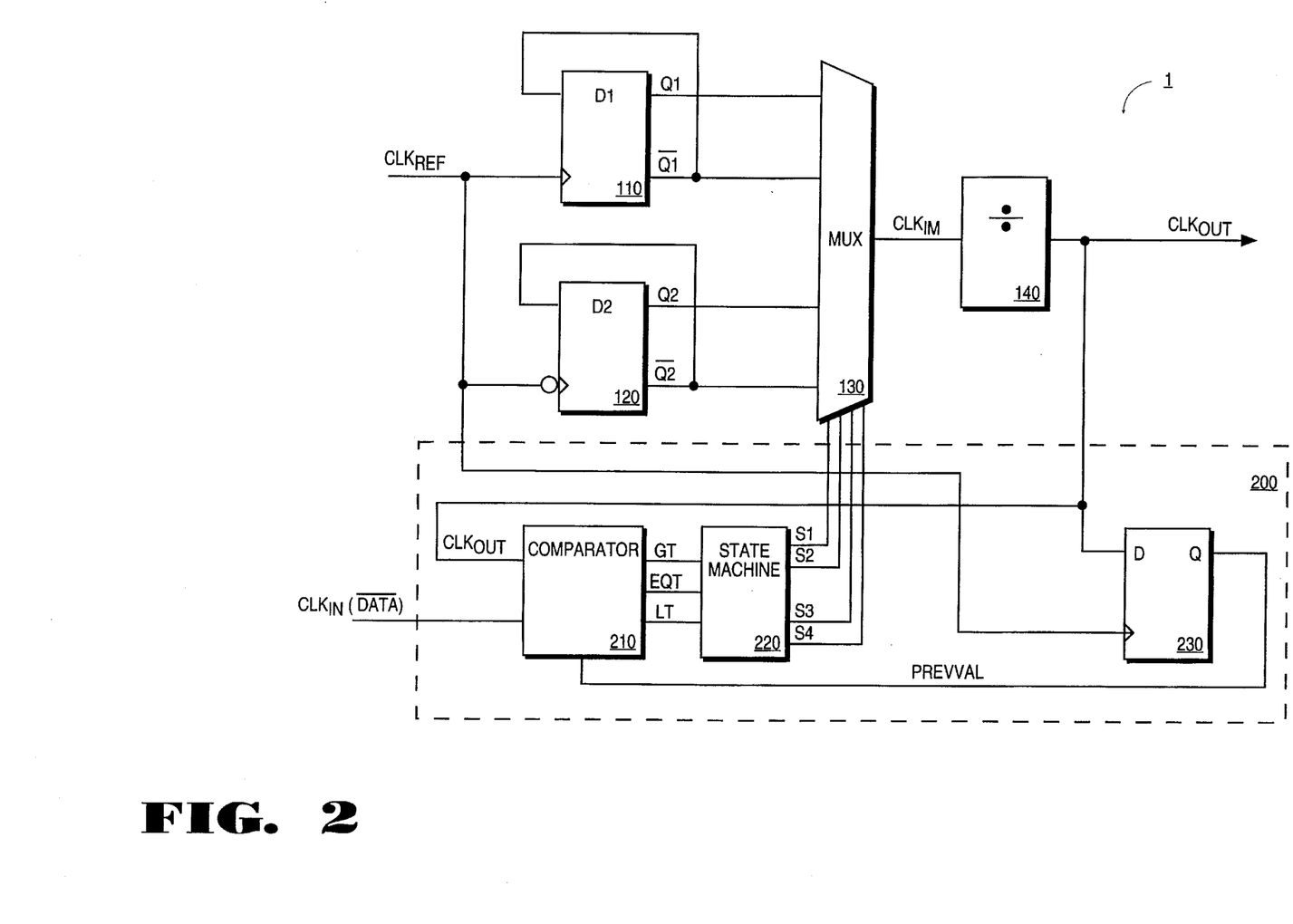
FIG. 2 shows a digital phase-locked loop including a comparator circuit and a state machine.

Referring now to FIG. 2, the control circuit 200 is shown in more detail. Control circuit 200 comprises a comparator 210, a state machine 220, and a D-type flip-flop 230. The comparator 210 receives the input clock signal CLKIN. In addition, the comparator 210 receives the output clock signal CLKOUT and a previous state signal PREVVAL. The previous state signal PREVVAL is received from the Q output of flip-flop 230. The comparator 210 generates three output signals which are provided to the state machine 220: a greater-than signal GT, a less-than signal LT, and an equal-to signal EQT. The state machine provides the selection signal S to the multiplexor 130. The selection signal S consists of four individual selection signals S1, S2, S3, and S4. The state machine also receives as input the reference clock CLKREF. The flip-flop 230 receives the output clock CLKOUT and is clocked by the reference clock CLKREF. Selection signals S1 through S4 correspond to inputs 1 through 4 of the multiplexor 130, respectively.

Figure 3:
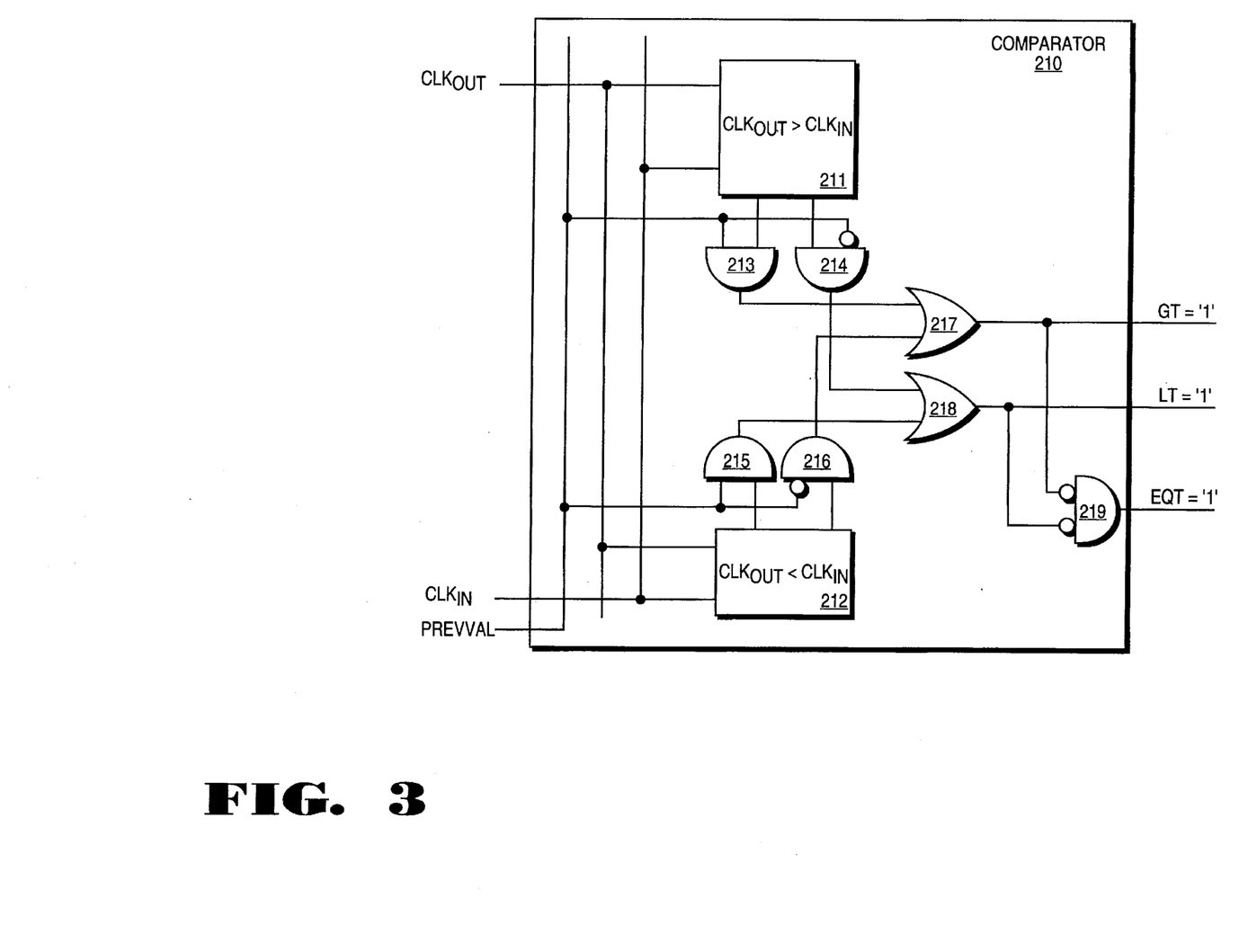
FIG. 3 depicts a comparator circuit according to an embodiment of the digital phase-locked loop.

Referring now to FIG. 3, the comparator circuit 210 is shown in detail. The comparator circuit 210 is comprised of a comparator 211 and a comparator 212. Comparators 211 and 212 each receive as input the input clock signal CLKIN and the output clock signal CLKOUT. The comparator circuit 210 also comprises AND gates 213, 214, 215, 216, and 219, and OR gates 217 and 218. Comparator 211 generates two outputs which are separately coupled to an input of AND gate 213 and an input of AND gate 214. The outputs of the comparator 211 are asserted as a logic high (i.e., logic "1") whenever the value of the output clock signal CLKOUT is greater than the value of the input clock signal CLKIN. In contrast, comparator 212 generates two outputs which are separately coupled to an input AND gate 215 and an input of AND gate 216. The outputs of comparator 212 are asserted as a logic high whenever the value of the output clock signal CLKOUT is less than the value of the input clock signal CLKIN. AND gate 213 also receives as input the previous state signal PREVVAL and generates an output coupled to an input of the OR gate 217. AND gate 214, in addition to receiving one of the outputs from comparator 211, receives as input the signal $\overline{PREVVAL}$ and generates an output which is coupled to one input of OR gate 218. AND gate 215 receives as input the previous state signal PREV- VAL and one of the outputs of comparator 212, and generates an output coupled to one of the inputs of OR gate 218. AND gate 216 receives one of the outputs of comparator 212 and the signal $\overline{PREVVAL}$, and provides an output coupled to one of the inputs of OR gate 217. The output of OR gate 217 is the greater-than signal GT. The output of OR gate 218 is the less-than signal LT. AND gate 218 receives as input the inverted greater-than signal $\overline{GT}$ and the inverted less-than signal $\overline{LT}$, and generates as output the equal-to signal EQT. The greater-than signal GT, the less-than signal LT, and the equal-to signal EQT each are asserted as logic high. Hence, the signals GT, LT, and EQT are generated according to the following logic equations:

$$GT=((CLK_{OUT}>CLK_{IN})\cdot(PREVVAL))+ \\ ((CLK_{OUT}<CLK_{IN})\cdot(\overline{PREVVAL})) \quad (1)$$

$$LT=((CLK_{OUT}>CLK_{IN})\cdot(\overline{PREVVAL}))+((CLK_{OUT} \\ <CLK_{IN})\cdot(PREVVAL)) \quad (2)$$

$$EQT=\overline{GT}\overline{LT} \quad (3)$$

where "·" represents logic AND, and "+" represents logic OR.

Figure 4A:
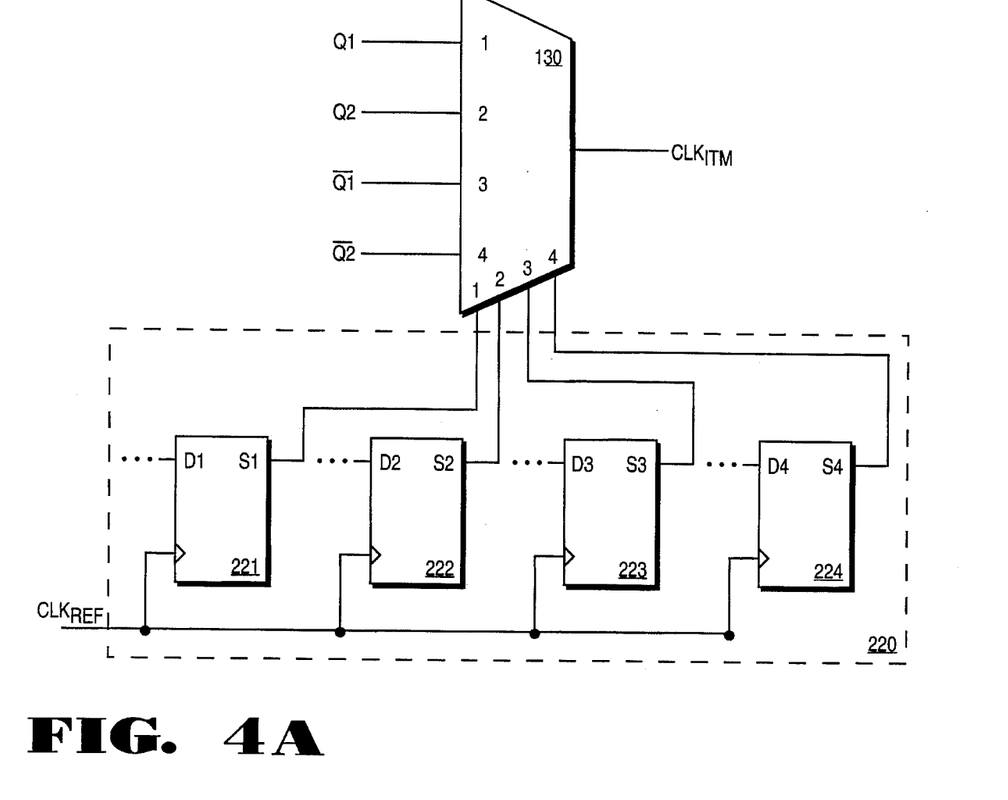
FIGS. 4A and 4B illustrate the details of a state machine according to an embodiment of the digital phase-locked loop.
Figure 4B:
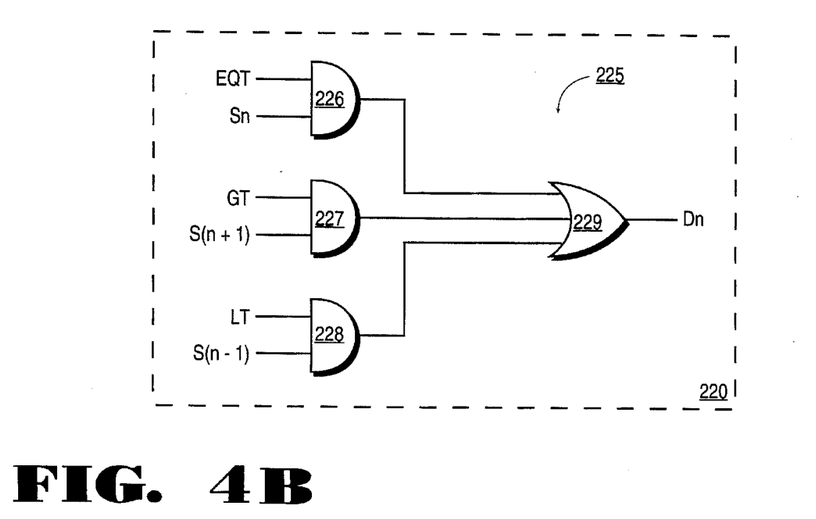

FIGS. 4A and 4B show the state machine 220 in detail with its connection to the multiplexor 130. Referring to FIG. 4A, the state machine 220 consists of four D-type flip-flops 221, 222, 223, and 224, each of which is clocked by the reference clock signal CLKREF. Flip-flops 221 through 224 output selection signals S1 through S4, respectively. Selection signals S1 through S4 correspond to the inputs Q1, Q2, $\overline{Q1}$, and $\overline{Q2}$ of the multiplexor, respectively. The multiplexor outputs an intermediate clock signal CLKITM which is at a frequency of one-half the frequency of the reference clock signal CLKREF. The inputs to flip-flops 221 through 224 are provided as signals D1 through D4, respectively.

Figure 5:
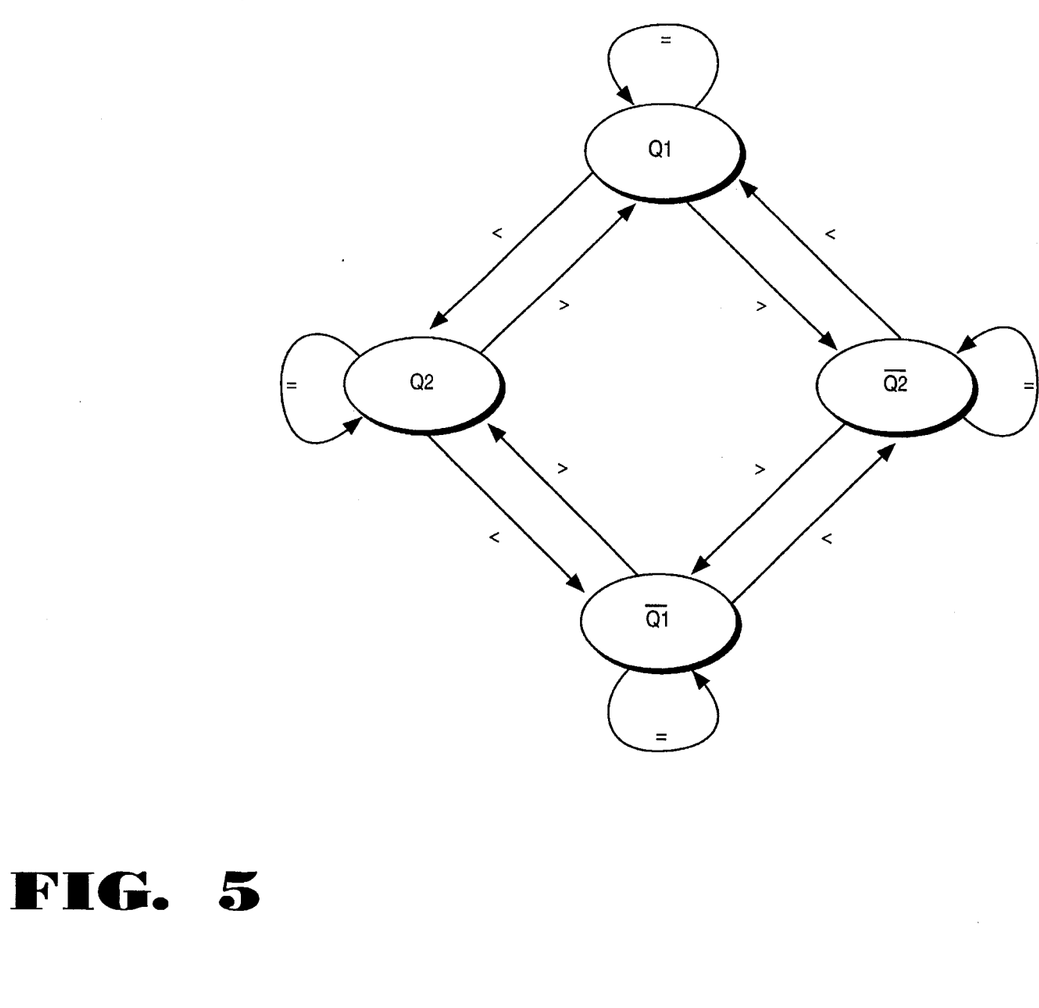
FIG. 5 depicts a state diagram representing the operation of the state machine.

Each of signals D1 through D4 is provided by one of four separate logic circuits 225. Logic circuit 225 is shown in FIG. 4B. Although there are actually four logic circuits 225, one for each of flip-flops 221 through 224, only one logic circuit 225 is shown for purposes of clarity. Logic circuit 225 generates as output the signal $D_n$ where n equals one, two, three, or four, depending upon whether the logic circuit 225 is associated with flip-flop 221, 222, 223, or 224. Each of the four logic circuits 225 consists of three AND gates 226, 227, 228, and an OR gate 229. OR gate 229 receives as input the outputs of AND gates 226, 227, and 228, and generates as output the signal Dn. AND gate 226 receives as input the equal-to signal EQT and one of the selection signals $S_n$ corresponding to one of the outputs of the flip-flops 221 through 224. AND gate 227 receives as input the greater-than signal GT and one of the selection signals $S_{(n+1)}$ corresponding to an output of another one of the flip-flops 221 through 224. Similarly, AND gate 228 receives as input the less-than signal LT and one of the selection signals $S_{(n-1)}$ corresponding to an output of one of the flip-flops 221 through 224. Note that the values of n "wrap around", such that if "n"=1, then "n−1" is 4; likewise if "n"=4 then "n+1" is 1. Hence, each of the flip-flops 221 through 224 is driven by one of four logic circuits 225 such that the inputs D1 through D4 are dependent upon the signals EQT, GT, and LT as well as the present state of that flip-flop and the present state of two of the other flip-flops 221 through 224. The function of the state machine 220 is described by the state diagram shown in FIG. 5. The state machine 220 has four states, Q1, Q2, $\overline{Q1}$, and $\overline{Q2}$ corresponding to the selection signals S1 through S4, respectively. The inputs $D_n$ to the flip-flops 221 through 224 are generated according to the following equation:

$$D_n = (EQT \cdot S_n) + (GT \cdot S(n+)) + (LT \cdot S(n-1)) \qquad (4)$$

The operation of the DPLL 1 will now be described. Referring to FIGS. 1 and 2, flip-flops 110 and 120 are coupled so that their respective outputs Q1, $\overline{Q1}$, Q2, and $\overline{Q2}$ each are provided at a frequency of one-half the frequency of the reference clock CLK$_{REF}$. A further effect of the coupling of flip-flops 110 and 120 is that signals Q1, $\overline{Q1}$, Q2, and $\overline{Q2}$ are provided at phases that are spaced 90 degrees apart. Specifically, $\overline{Q1}$ is in-phase with the reference clock CLK$_{REF}$, while signal $\overline{Q1}$ lags signal Q1 in phase by 90 degrees. Similarly, signal Q2 lags signal $\overline{Q1}$ in phase by 90 degrees and signal $\overline{Q2}$ lags Q2 in phase by 90 degrees. The phase and frequency characteristics of signals Q1, $\overline{Q1}$, Q2, and $\overline{Q2}$ can be seen in the timing diagram of FIG. 7. The 90 degree phase difference between each of signals Q1, $\overline{Q1}$, Q2, and $\overline{Q2}$ is equal to a phase difference of one-half of a clock period of the reference clock CLK$_{REF}$. Therefore, the multiplexor 130 provides at its output one of four clock signals differing in phase by one-half of a period of the reference clock CLK$_{REF}$, so that the maximum jitter when the DPLL 1 is phase-locked is one-half of a clock period of the reference clock CLK$_{REF}$.

The comparator circuit 210 generates signals GT, LT, and EQT according to equations (1), (2), and (3), above. Flip-flop 230 stores the last state of the output clock CLK$_{OUT}$, which is output to the comparator circuit 210 as the previous state signal PREVVAL. The previous state signal PREVVAL is used by the comparator circuit 210 essentially as an indication of whether the next edge of the input clock signal CLK$_{IN}$ will be a rising edge or a falling edge. Specifically, a value of "0" for PREVVAL indicates that the next edge of the input clock CLK$_{IN}$ will be a rising edge, whereas a value of "1" for PREVVAL indicates that the next edge will be a falling edge.

Figure 6:
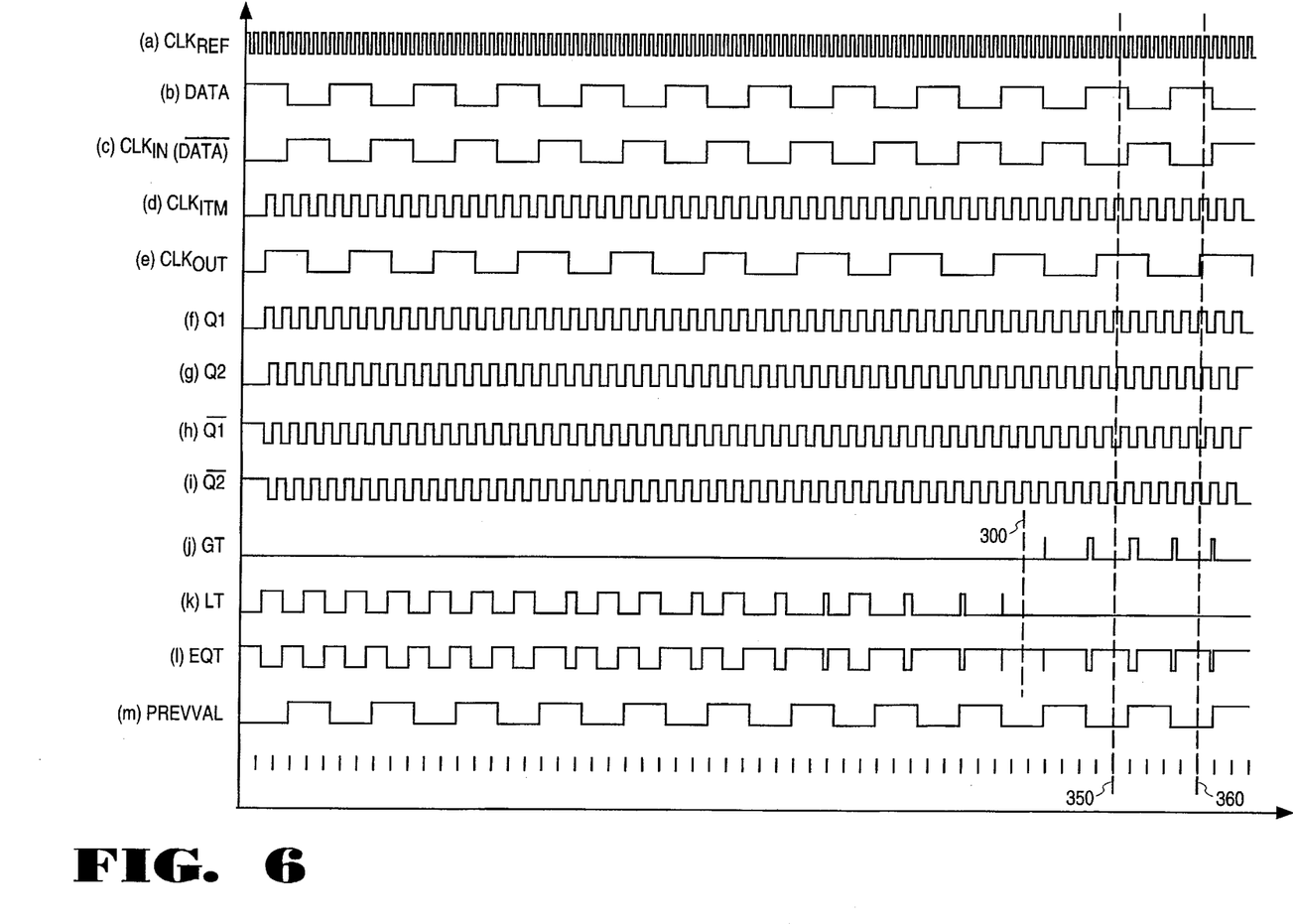
FIG. 6 shows a timing diagram associated with an embodiment of the digital phase-locked loop.

Referring again to FIG. 5, the state machine has four states, Q1, Q2, $\overline{Q1}$, and $\overline{Q2}$, as described earlier. An equal-to EQT output from the comparator circuit 210 indicates that the output clock signal CLK$_{OUT}$ and the input clock signal CLK$_{IN}$ have equal value. If the state machine receives an equal-to EQT input when it is clocked, then the state will remain the same, and whichever input of the multiplexor 130 (Q1, Q2, $\overline{Q1}$, and $\overline{Q2}$) is presently selected will remain selected. When the state machine is in state Q1, for example, a greater-than output GT from the comparator circuit 210 will cause the state machine to assert only signal S4, causing the $\overline{Q2}$ input to the multiplexor 130 to be selected. Similarly, when the state $\overline{Q2}$ has been selected, a greater-than GT output from the comparator circuit 210 will cause only the signal S3 to be asserted, causing the $\overline{Q1}$ input of the multiplexor to be selected, and so forth. If the state Q1 is presently selected, then a less-than LT output from the comparator circuit 210 will cause only the signal S2 to be asserted, causing the input Q2 of the multiplexor 130 to be selected. Therefore, the state machine 220 functions by selecting one of signals Q1, Q2, $\overline{Q1}$, or $\overline{Q2}$ to most closely match the phase of the input clock signal CLK$_{IN}$. The DPLL 1 is accurate to within one-half of a clock period of the reference clock signal CLK$_{REF}$ FIG. 6 shows a timing diagram associated with the DPLL 1. The case is illustrated where DPLL 1 progresses from a condition where the output clock CLK$_{OUT}$ is completely out-of-phase with the input clock CLK$_{IN}$ and then progresses gradually to a locked state. This progression can be seen easily by the repeated assertion of less-than LT pulses until the output clock CLK$_{OUT}$ is locked in frequency and phase to the input clock CLK$_{IN}$. The progression can further be seen by the gradual narrowing over time of less-than LT pulses and the consequent lengthening over time of the equal-to EQT pulses. The locked condition occurs at approximately time point 300 on the timing diagram of FIG. 6. At point 300, the less-than LT pulses have ceased to be asserted and the greater-than GT pulses GT begin to be asserted to hold the DPLL 1 in the locked condition. In the locked condition, the equal-to EQT signal will remain asserted most of the time, with occasional greater-than GT or less-than LT pulses being asserted in order to maintain the lock.

Figure 7:
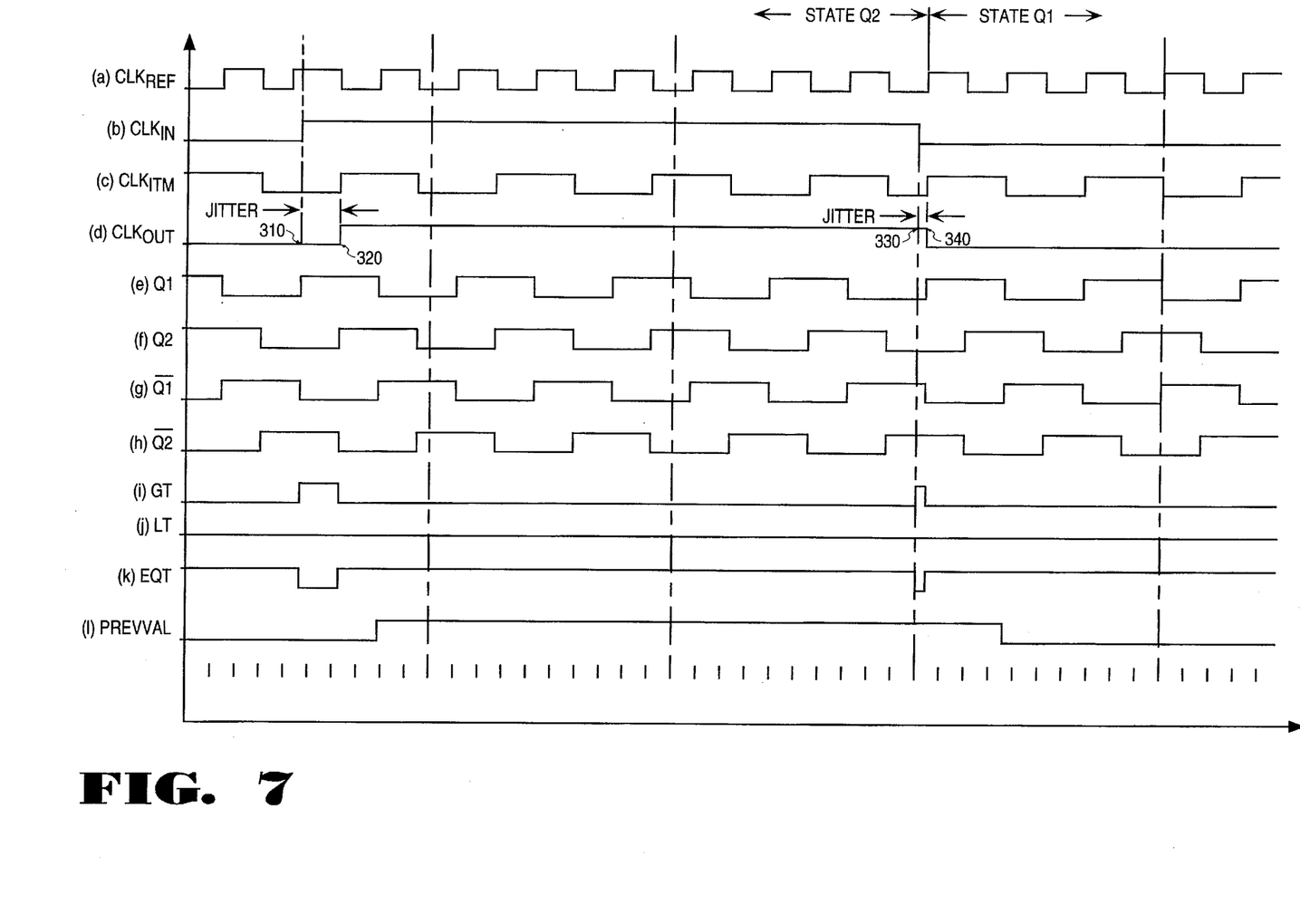
FIG. 7 shows a timing diagram showing in detail the results of a change in state of the state machine.

FIG. 7 shows certain ones of the waveforms in FIG. 6 on an expanded time scale, corresponding to the period in FIG. 6 from time point 350 to time point 360 (after lock has been achieved). The inherent jitter of the DPLL 1 is illustrated by the space between points 310 and 320 on the waveform of the output clock signal CLK$_{IN}$. At point 310, the DPLL is in state Q2. At point 310, the input clock CLK$_{OUT}$ goes high but the output clock CLK$_{OUT}$ remains low, creating a phase difference between the two signals. The greater-than signal GT is asserted because the value of the input clock CLK$_{IN}$ is greater than the value of the output clock CLK$_{OUT}$ and a rising edge of the output clock CLK$_{OUT}$ is about to occur (see equation (1)). However, there is no change in state of the DPLL 1, because signal Q2 (and, therefore, signal CLK$_{OUT}$) goes high before the next rising edge of the reference clock CLK$_{REF}$ occurs. Note, however, that the jitter illustrated between points 310 and 320 does not exceed one-half of a clock period of the reference clock CLK$_{REF}$.

The next transition of the input clock CLK$_{IN}$ occurs at point 330. At point 330, the output clock signal CLK$_{OUT}$ has not transitioned to a low state even though the input clock CLK$_{IN}$ already has. Consequently, a greater than signal GT is asserted at point 330. Upon the next rising edge of the reference clock CLK$_{REF}$, which occurs at point 340, the DPLL 1 transitions from state Q2 to Q1, so that the phase of the output clock CLK$_{OuT}$ is more closely matched to the phase of the input clock CLK$_{IN}$.

Hence, the DPLL 1 adjusts the phase of its output clock signal CLK$_{OUT}$ at each rising edge and at each falling edge of the input clock CLK$_{IN}$. Furthermore, the DPLL 1 provides the output clock CLK$_{OUT}$ at the same frequency as the input data signal DATA with a phase lock having jitter that will not exceed one-half of a clock period of the reference clock CLK$_{REF}$.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A digital phase-locked loop (DPLL) for receiving an input clock having a plurality of rising edges and falling edges and a frequency, the DPLL for generating an output clock having a frequency and a phase which are locked to the input clock, the DPLL comprising:

a generator circuit for receiving a reference clock and for generating the output clock, wherein the phase of the output clock is one of a plurality of selectable phases such that the difference in phases between the output clock and the input clock is limited to one-half of a period of the reference clock when the DPLL is in a locked state; and a control circuit for receiving the input clock, the reference clock, and the output clock and for providing a selection input to the generator circuit such that the phase of the output clock is selectable at each rising edge and at each falling edge of the input clock.

2. The DPLL according to claim 1, wherein the output clock has one of four selectable phases, the four selectable phases differing from each other by consecutive phase increments of one-half of a period of the reference clock, wherein a first of the four selectable phases is aligned with the reference clock.

3. The DPLL according to claim 2, wherein the generator circuit comprises:
a circuit for generating an intermediate clock having a frequency of one-half of the frequency of the reference clock and having one of the four selectable phases; and
a frequency divider for receiving the intermediate clock and for generating the output clock at the frequency of the input clock.

4. The DPLL according to claim 2, wherein the control circuit comprises a state machine for selecting one of the four selectable phases based on the output clock, the input clock, and a previous state of the state machine.

5. The DPLL according to claim 1, wherein the generator circuit comprises:
a first flip-flop for outputting a first clock and a second clock, the second clock coupled to an input of the first flip-flop, the first flip-flop clocked by the reference clock, the first clock and the second clock each having a frequency of one half the frequency of the reference clock, wherein the first clock is in-phase with the reference clock and the second clock is 90 degrees out-of-phase with the first clock;
a second flip-flop for outputting a third clock and a fourth clock, the fourth clock coupled to an input of the second flip-flop, the second flip-flop clocked by the reference clock, the third clock and the fourth clock each having a frequency of one half the frequency of the reference clock, wherein the third clock is 90 degrees out-of-phase with the second clock and the fourth clock is 90 degrees out-of-phase with the third clock; and
a multiplexor having four inputs for receiving the first clock, the second clock, the third clock, and the fourth clock, and for outputting either the first clock, the second clock, the third clock, or the fourth clock according to a selection input; and
a frequency divider for receiving the output of the multiplexor and for generating in response thereto the output clock at the frequency of the input clock.

6. The DPLL according to claim 5, wherein the output of the multiplexor has a frequency eight (8) times the frequency of the output clock.

7. The DPLL according to claim 1, wherein the control circuit comprises:
a third flip-flop for receiving the output clock and for outputting a previous state signal, wherein the third flip-flop is clocked by the reference clock;
a comparator circuit for receiving the output clock, the input clock, and the state signal, the comparator circuit for selectively generating either a greater-than output, a less-than output, or an equal-to output based on the combined states of the output clock, the input clock, and the previous state signal; and
a state machine for receiving the reference clock, the greater-than signal, the less-than signal, and the equal-to signal, the state machine for generating the selection input corresponding to a present state of the state machine based on the greater-than signal, the less-than signal, the equal-to signal, and a previous state of the state machine.

8. The DPLL according to claim 5, wherein the selection input comprises a plurality of selection signals, each corresponding to a different input of the multiplexor.

9. The DPLL according to claim 8, wherein the state machine comprises:
a fourth flip-flop, a fifth flip-flop, a sixth flip-flop, and a seventh flip-flop for storing the present state of the state machine, each for providing a separate one of the four selection signals; and
a plurality of logic circuits, each of the logic circuits for receiving the greater-than signal, the less-than signal, the equal-to signal, and a plurality of the four selection signals, each of the logic circuits for providing a separate input to one of the fourth flip-flop, the fifth flip-flop, the sixth flip-flop, and the seventh flip-flop.

10. The DPLL according to claim 7, wherein the comparator circuit comprises:
a first comparator and a second comparator, each for receiving the output clock and the input clock; and
a comparator logic circuit for receiving an input from the first comparator and an input from the second comparator and for generating in response thereto the greater-than signal, the less-than signal, and the equal-to signal in a mutually exclusive manner.

11. A digital phase-locked loop (DPLL) for receiving an input clock having a plurality of rising edges and falling edges and a frequency, the DPLL for generating an output clock having a frequency and a phase which are locked to the input clock, the DPLL comprising:
a first flip-flop for outputting a first clock and a second clock, the second clock coupled to an input of the first flip-flop, the first flip-flop clocked by a reference clock having a frequency, the first clock and the second clock each having a frequency of one half the frequency of the reference clock, wherein the first clock is in-phase with the reference clock and the second clock is 90 degrees out-of-phase with the first clock;
a second flip-flop for outputting a third clock and a fourth clock, the fourth clock coupled to an input of the second flip-flop, the second flip-flop clocked by the reference clock, the third clock and the fourth clock each having a frequency of one half the frequency of the reference clock, wherein the third clock is 90 degrees out-of-phase with the second clock and the fourth clock is 90 degrees out-of-phase with the third clock;
a multiplexor having four inputs for receiving the first clock, the second clock, the third clock, and the fourth clock and for outputting either the first clock, the second clock, the third clock, or the fourth clock according to a selection input;
a frequency divider for receiving the output of the multiplexor and for generating in response thereto the output clock; and
a control circuit for receiving the input clock, the reference clock, and the output clock and for providing the selection input to the multiplexor, the control circuit updating the selection input upon each rising edge and upon each falling edge of the input clock, such that the phase of the output clock is selectable at each rising edge and at each falling edge of the input clock and the difference in phases between the output clock and the input clock is limited to one-half of a period of the reference clock once the phase of the output clock is locked to the input clock.

12. The DPLL according to claim 11, wherein the control circuit comprises:

a third flip-flop for receiving the output clock as input and for outputting a previous state signal, wherein the third flip-flop is clocked by the reference clock;

a comparator circuit for receiving the output clock, the input clock, and the previous state signal, the comparator circuit for selectively generating either a greater-than signal, a less-than signal, or an equal-to signal based on the states of the output clock, the input clock, and the previous state signal; and a state machine for receiving the reference clock, the greater-than signal, the less-than signal, and the equal-to signal, the state machine for generating the selection input corresponding to a present state of the state machine based on the greater-than signal, the less-than signal, the equal-to signal, and a previous state of the state machine.

13. The DPLL according to claim 11, wherein the selection input comprises four (4) selection signals, each of the selection signals corresponding to a different input of the multiplexor.

14. The DPLL according to claim 12, wherein the state machine comprises:

a fourth flip-flop, a fifth flip-flop, a sixth flip-flop, and a seventh flip-flop for storing the present state of the state machine, each of the fourth flip-flop, the fifth flip-flop, the sixth flip-flop, and the seventh flip-flop for providing a separate one of the four selection signals; and a plurality of logic circuits, each of the logic circuits for receiving the greater-than signal, the less-than signal, the equal-to signal, and a plurality of the four selection signals, each of the logic circuits for providing a separate input to one of the fourth flip-flop, the fifth flip-flop, the sixth flip-flop, and the seventh flip-flop.

15. The DPLL according to claim 12, wherein the comparator circuit comprises:

a first comparator and a second comparator, each for receiving the output clock and the input clock; and a comparator logic circuit for receiving an input from the first comparator and an input from the second comparator and for generating in response thereto the greater-than signal, the less-than signal, and the equal-to signal in a mutually exclusive manner.

16. The DPLL according to claim 11, wherein the output of the multiplexor has a frequency eight (8) times the frequency of the output clock.

17. A digital phase-locked loop (DPLL) for receiving an input clock having a plurality of rising edges and falling edges and a frequency, the DPLL for generating an output clock having a frequency and a phase which are locked to the input clock, the DPLL comprising:

generator means for receiving a reference clock having a reference frequency and for generating an intermediate clock having a frequency of one-half the reference frequency, the intermediate clock having one of four selectable phases according to a selection input, the four selectable phases differing from each other by consecutive phase increments of 90 degrees, wherein a first of the four selectable phases is in-phase with the reference clock;

frequency divider means for receiving the intermediate clock and for generating the output clock at the frequency of the input clock; and control means for receiving the input clock, the reference clock, and the output clock and for providing the selection input to the generator means such that the phase of the output clock is selectable at each rising edge and each falling edge of the input clock, wherein a phase difference between the output clock and the input clock is limited to one-half of a period of the reference clock once the DPLL is locked to the input clock.

18. The DPLL according to claim 17, wherein the control means comprises state machine means having a present state for generating the selection input corresponding to the present state of the state machine means based on the output clock, the input clock, and a previous state of the state machine means.

19. The DPLL according to claim 18, wherein the generator means comprises multiplexor means for outputting the intermediate clock, the multiplexor means having four inputs, each of the four inputs of the multiplexor means corresponding to a separate one of the four selectable phases.

20. The DPLL according to claim 19, wherein the selection input comprises a plurality of selection signals for selecting one of the four inputs of the multiplexor means.

21. A method of generating an output clock having a phase and a frequency which are locked to a phase and a frequency of an input clock having a plurality of rising edges and falling edges, the method comprising the steps of:

providing a reference clock having a reference frequency;

providing a plurality of intermediate clocks, each having one of a plurality of selectable phases, the selectable phases differing from each other by consecutive phase increments of one-half of a period of the reference clock, wherein a first of the selectable phases is aligned with the reference clock; and selecting one of the intermediate clocks to provide the output clock at each rising edge and each falling edge of the input clock, such that the difference in phase between the output clock and the input clock is limited to one-half of the period of the reference clock once the DPLL is locked to the input clock.

22. The method according to claim 21, further comprising the step of dividing down the frequency of the intermediate clock selected in the selecting step to produce the output clock.

23. The method according to claim 22, wherein the selecting step is performed according to a present state of a state machine, and wherein the selecting step is performed based on the states of the output clock, the input clock, and a previous state of the state machine.

* * * * *

UNITED STATES PATENT AND TRADEMARK OFFICE
CERTIFICATE OF CORRECTION

PATENT NO. : 5,546,434
DATED : August 13, 1996
INVENTOR(S) : Stavros Kalafatis

It is certified that error appears in the above-indentified patent and that said Letters Patent is hereby corrected as shown below:

In column 3 at line 11 delete "Outputs" and insert --outputs--

In column 4 at line 5 delete "0R" and insert --OR--

In column 4 at line 20 delete "$\overline{EQT}=\overline{GTLT}$" and insert --$\overline{EQT}=\overline{GT} \cdot \overline{LT}$--

In column 4 at line 51 delete "$S_{(n+1)}$" and insert --$S_{(n+1)}$--

In column 4, line 66 delete "$D_n$" and insert --$D_n$--

Signed and Sealed this

Twenty-fourth Day of December, 1996

Attest:

BRUCE LEHMAN

Attesting Officer

Commissioner of Patents and Trademarks